US012683614B2

(12) United States Patent
Yang et al.

(10) Patent No.: US 12,683,614 B2
(45) Date of Patent: Jul. 14, 2026

(54) CLOCK SIGNAL NOISE REDUCTION DEVICE AND NOISE REDUCTION METHOD, AND MULTI-PHASE DELAY PHASE-LOCKED LOOP

(71) Applicant: AMLOGIC (SHANGHAI) CO., LTD., Shanghai (CN)

(72) Inventors: Yang Yang, Shanghai (CN); Xu Guo, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 290 days.

(21) Appl. No.: 18/415,692

(22) Filed: Jan. 18, 2024

(65) Prior Publication Data

US 2024/0195421 A1 Jun. 13, 2024

Related U.S. Application Data

(63) Continuation of application No. PCT/CN2023/123465, filed on Oct. 9, 2023.

(30) Foreign Application Priority Data

Dec. 8, 2022 (CN) .......................... 202211579269.0

(51) Int. Cl.
$H03L\ 7/081$ (2006.01)
$H03L\ 7/099$ (2006.01)

(52) U.S. Cl.
CPC .......... H03L 7/0818 (2013.01); H03L 7/0992 (2013.01)

(58) Field of Classification Search
CPC .............................. H03L 7/0818; H03L 7/0992
See application file for complete search history.

(56) References Cited

U.S. PATENT DOCUMENTS 5,907,253 A * 5/1999 Davis .................... H03L 7/1976
327/158
5,970,110 A * 10/1999 Li .......................... H03L 7/0995
327/236
(Continued)

FOREIGN PATENT DOCUMENTS

CN 101378259 A 3/2009
CN 108736888 A 11/2018
(Continued)

OTHER PUBLICATIONS

S.-H. Shin, P.-H. Lee, J.-W. Park, Y.-J. Hwang and Y.-C. Jang, "0.5 kHz-32 MHz digital fractional-N frequency synthesizer with burst-frequency switch," 2017 IEEE International Symposium on Circuits and Systems (ISCAS), Baltimore, MD, USA, 2017, pp. 1-4, doi: 10.1109/ISCAS.2017.8050286. (no date).*

(Continued)

*Primary Examiner* — Adam D Houston

(57) ABSTRACT

The present disclosure discloses a clock signal noise reduction device and noise reduction method, and a multi-phase delay phase-locked loop. The clock signal noise reduction device includes a phase generator, a phase selector, and a frequency divider. The phase generator is configured to generate a multi-phase clock signal based on an input signal. The phase selector has an input end connected with an output end of the phase generator, and is configured to select a channel of the multi-phase clock signal based on phase information and assign a delay of a preset period to a clock signal of the selected channel. The preset period is less than a cycle period of the multi-phase clock signal. The frequency divider has an input end connected to an output end of the phase selector, and is configured to perform fractional frequency division on the multi-phase clock signal delayed by the preset period.

20 Claims, 5 Drawing Sheets

(56) References Cited

U.S. PATENT DOCUMENTS

| | | | | | |
|---|---|---|---|---|---|
| 6,157,694 | A | | 12/2000 | Larsson | |
| 7,486,145 | B2 | * | 2/2009 | Floyd | H03L 7/1974 |
| | | | | | 331/34 |
| 7,560,962 | B2 | * | 7/2009 | Kamath | H03K 23/48 |
| | | | | | 327/158 |
| 7,965,808 | B2 | * | 6/2011 | Marutani | H03K 23/667 |
| | | | | | 377/47 |
| 7,977,994 | B2 | * | 7/2011 | Yousefzadeh | H03K 7/08 |
| | | | | | 327/273 |
| 8,564,348 | B1 | * | 10/2013 | Staszewski | H03L 7/0996 |
| | | | | | 327/158 |
| 8,963,588 | B2 | * | 2/2015 | Da Dalt | H03L 7/1976 |
| | | | | | 327/158 |
| 11,005,479 | B2 | * | 5/2021 | Im | H03L 7/0814 |
| 11,258,433 | B1 | * | 2/2022 | Urakawa | G06F 1/06 |
| 11,271,710 | B1 | * | 3/2022 | Cho | H03B 27/00 |
| 11,849,015 | B1 | * | 12/2023 | Zhao | H03L 7/0807 |
| 2008/0164917 | A1 | * | 7/2008 | Floyd | H03L 7/1974 |
| | | | | | 375/376 |
| 2009/0091362 | A1 | * | 4/2009 | Pellerano | H03L 7/07 |
| | | | | | 327/158 |
| 2010/0045354 | A1 | * | 2/2010 | Lin | G11C 11/4072 |
| | | | | | 327/291 |
| 2011/0109355 | A1 | * | 5/2011 | Sakaguchi | H03L 7/23 |
| | | | | | 327/157 |
| 2012/0154005 | A1 | * | 6/2012 | Frederiksen | H03K 7/08 |
| | | | | | 327/175 |
| 2012/0161827 | A1 | * | 6/2012 | Madeira | G06F 1/06 |
| | | | | | 327/147 |
| 2013/0049821 | A1 | * | 2/2013 | Da Dalt | H03L 7/1976 |
| | | | | | 327/117 |
| 2013/0271193 | A1 | * | 10/2013 | Keith | H03L 7/10 |
| | | | | | 327/158 |
| 2014/0070857 | A1 | * | 3/2014 | Huang | H03L 7/1976 |
| | | | | | 327/156 |
| 2016/0182063 | A1 | * | 6/2016 | Seo | H03L 7/16 |
| | | | | | 327/149 |
| 2024/0195421 | A1 | * | 6/2024 | Yang | G06F 1/06 |

FOREIGN PATENT DOCUMENTS

| | | | | | | |
|---|---|---|---|---|---|---|
| CN | 114584135 | A | * | 6/2022 | | H03L 7/093 |
| CN | 114584137 | A | | 6/2022 | | |
| CN | 116131845 | A | * | 5/2023 | | G06F 1/06 |
| CN | 117081591 | A | * | 11/2023 | | H03L 7/18 |
| EP | 3618281 | A1 | * | 3/2020 | | H03L 7/081 |
| JP | 2006073182 | A | | 3/2006 | | |
| WO | 2017105349 | A1 | | 6/2017 | | |

OTHER PUBLICATIONS

Seung-Hun Shin et al., 0.5 kHz-32 MHz Digital Fractional-N Frequency Synthesizer with Burst-Frequency Switch, 2017 IEEE International Symposium On Circuits and Systems (ISCAS), May 28, 2017, pp. 1-4.

* cited by examiner

10

CLK_SEL<3:0>

CK<3:0>

1

<u>10</u>

Multi-phase Delay Locked Loop 100

Clock Signal Noise Reduction
Device 10

CLOCK SIGNAL NOISE REDUCTION DEVICE AND NOISE REDUCTION METHOD, AND MULTI-PHASE DELAY PHASE-LOCKED LOOP

CROSS-REFERENCE TO RELATED APPLICATIONS

The present application is a continuation of International Application No. PCT/CN2023/123465 titled "CLOCK SIG-NAL NOISE REDUCTION DEVICE AND NOISE REDUCTION METHOD, AND MULTI-PHASE DELAY PHASE-LOCKED LOOP" and filed on Oct. 9, 2023 which claims the priority to the Chinese patent application No. 202211579269.0 entitled "CLOCK SIGNAL NOISE REDUCTION DEVICE AND NOISE REDUCTION METHOD, AND MULTI-PHASE DELAY PHASE-LOCKED LOOP" and filed with the China National Intel-lectual Property Administration on Dec. 8, 2022, the entire-ties of both of which are incorporated herein by reference.

TECHNICAL FIELD

The present disclosure relates to the field of clock circuit technology, more particularly, to a clock signal noise reduc-tion device, a clock signal noise reduction method, and a multi-phase delay phase-locked loop.

BACKGROUND

In some applications of local oscillators, a clock signal output from a phase-locked loop (PLL) is recommended to be frequency-divided by a frequency divider with an odd factor. Delay phase-locked loop circuits are widely used in high-speed circuit systems to generate multi-phase clocks. The multi-phase delay PLL can generate multiple output clocks of the same frequency based on one input clock, and the phases intervals among the multiple output clocks are the same. After the multiple output clocks of the same frequency enter the frequency divider, the frequency divider will convert high-frequency signals of the multiple output clocks of the same frequency into low-frequency signal outputs.

In related technologies, when multiple output clocks of the same frequency are generated and are subject to a frequency division processing by a frequency divider, the output clock signal after the frequency division processing has a relatively large noise. In the design of connected radio frequency integrated circuits, it is necessary to improve the performance of the decimal frequency divider.

SUMMARY

The present disclosure aims to solve at least one of the technical problems existing in the prior art. Therefore, A first purpose of the present disclosure is to propose a clock signal noise reduction device that can reduce signal noise and improve the performance of a frequency divider.

A second purpose of the present disclosure is to propose a clock signal noise reduction method.

A third purpose of the present disclosure is to propose a multi-phase delay phase-locked loop.

In order to achieve the above purposes, a clock signal noise reduction device is provided according to an embodi-ment in a first aspect of the present disclosure. The clock signal noise reduction device includes: a phase generator configured to generate a multi-phase clock signal based on an input signal; a phase selector having a input end connected with an output end of the phase generator, the phase selector being configured to select a channel of the multi-phase clock signal based on phase information and assign a delay of a preset period to a clock signal of the selected channel, wherein the preset period is less than a cycle period of the multi-phase clock signal; and a frequency divider having an input end connected to an output end of the phase selector, the frequency divider being configured to perform fractional frequency division on the multi-phase clock signal that is delayed by the preset period to reduce a signal noise.

According to the clock signal noise reduction device proposed in the embodiment of the present disclosure, it can delay the multi-phase clock signal output by the phase generator by the preset period through setting the phase selector, so that the frequency divider can obtain a fractional frequency dividing ratio after performing a fractional fre-quency division on the multi-phase clock signal delayed by the preset period, thereby reducing the noise of the output low-frequency signal to a fraction of its original noise, and thus reducing the signal noise and improving the perfor-mance of the frequency divider.

In some embodiments of the present disclosure, the clock signal noise reduction device further includes a phase detec-tor connected to an output end of the frequency divider and a signal regulating end of the phase generator. The phase detector is configured to obtain a phase difference between a clock signal in a current channel that has been subject to the fractional frequency division and a clock signal in an immediately previous channel that has been subject to the fractional frequency division and generate a first delay adjustment signal based on the phase difference. The phase generator is further configured to adjust the delay of the clock signal in the current channel or the clock signal in the immediately previous channel based on the first delay adjustment signal.

In some embodiments of the present disclosure, the clock signal noise reduction device further includes a phase delayer connected to the output end of the frequency divider and an input end of the phase detector. The phase delayer is configured to perform a delay processing on the multi-phase clock signal that has been subject to the fractional frequency division. The phase detector is connected to an output end of the phase delayer and is configured to generate a second delay adjustment signal based on the multi-phase clock signal that has been subject to the fractional frequency division and the multi-phase clock signal that has been subject to the fractional frequency division and the delay processing. The phase delayer is further configured to adjust, based on the second delay adjustment signal, a delay time length for the delay processing on the multi-phase clock signal that has been subject to the fractional frequency division.

In some embodiments of the present disclosure, the phase generator is a four-phase generator, and each phase genera-tor in the four-phase generator includes a variable capacitor configured to adjust, based on the first delay adjustment signal, the delay of the clock signal of the phase generator where the variable capacitor is located.

In some embodiments of the present disclosure, the phase generator is further configured to adjust a variable resistor in the phase generation circuit corresponding to the clock signal in the current channel based on the first delay adjust-ment signal to adjust the delay of the clock signal in the current channel, or configured to adjust a variable resistor in the phase generation circuit corresponding to the clock signal in the immediately previous channel to adjust the delay of the clock signal in the immediately previous channel.

In some embodiments of the present disclosure, the preset period is 0.25 times the cycle period of the multi-phase clock signal, 0.5 times the cycle period of the multi-phase clock signal or 0.75 times the cycle period of the multi-phase clock signal.

In order to achieve the above purposes, a clock signal noise reduction method is provided according to an embodiment in a second aspect of the present disclosure. The clock signal noise reduction method includes: obtaining a multi-phase clock signal; selecting a channel of the multi-phase clock signal based on phase information and assigning a delay of a preset period to a clock signal of the selected channel, the preset period being less than a cycle period of the multi-phase clock signal; and performing fractional frequency division on the multi-phase clock signal that is delayed by the preset period to reduce a signal noise.

According to the clock signal noise reduction method proposed in the embodiment of the present disclosure, the generated multi-phase clock signal is delayed by a preset period, so that the frequency divider can obtain a decimal frequency dividing ratio after performing the fractional frequency division on the multi-phase clock signal that is delayed by the preset period, so as to reduce the noise of the output low-frequency signal to a fraction of its original noise and thus to reduce the signal noise and improve the performance of the frequency divider.

In some embodiments of the present disclosure, the clock signal noise reduction method further includes: obtaining a phase difference between a clock signal in a current channel that has been subject to the fractional frequency division and a clock signal in an immediately previous channel that has been subject to the fractional frequency division and generating a first delay adjustment signal based on the phase difference; and adjusting the delay of the clock signal in the current channel or the clock signal in the immediately previous channel based on the first delay adjustment signal.

In some embodiments of the present disclosure, the clock signal noise reduction method further includes: performing a delay processing on the multi-phase clock signal that has been subject to the fractional frequency division; generating a second delay adjustment signal based on the multi-phase clock signal that has been subject to the fractional frequency division and the multi-phase clock signal that has been subject to the fractional frequency division and the delay processing; and adjusting, based on the second delay adjustment signal, a delay time length for the delay processing on the multi-phase clock signal that has been subject to the fractional frequency division.

In some embodiments of the present disclosure, the adjusting the delay of the clock signal in the current channel or the clock signal in the immediately previous channel based on the first delay adjustment signal includes: adjusting a variable resistor in a phase generation circuit corresponding to the clock signal in the current channel based on the first delay adjustment signal to adjust the delay of the clock signal in the current channel, or adjusting a variable resistor in a phase generation circuit corresponding to the clock signal in the immediately previous channel to adjust the delay of the clock signal in the immediately previous channel.

In some embodiments of the present disclosure, the preset period is 0.25 times the cycle period of the multi-phase clock signal or 0.5 times the cycle period of the multi-phase clock signal or 0.75 times the cycle period of the multi-phase clock signal.

In order to achieve the above purposes, a multi-phase delay phase-locked loop is provided according to an embodiment in a third aspect of the present disclosure. The multi-phase delay phase-locked loop includes a clock signal noise reduction device as described in any of the above embodiments.

In the multi-phase delay phase-locked loop according to the embodiment of the present disclosure, by setting a clock signal noise reduction device, it can not only ensure to the maximum extent that the delay time periods of respective delay units are equal, but also reduce a signal noise.

The additional aspects and advantages of this application will be provided in the following description, which will become apparent from the following description, or will be learned through the practice of this application.

BRIEF DESCRIPTION OF DRAWINGS

The above and/or additional aspects and advantages of the present disclosure will become apparent and easy to understand from the description of embodiments in conjunction with the accompanying drawings, in which.

REFERENCE NUMERALS

Figure 1:
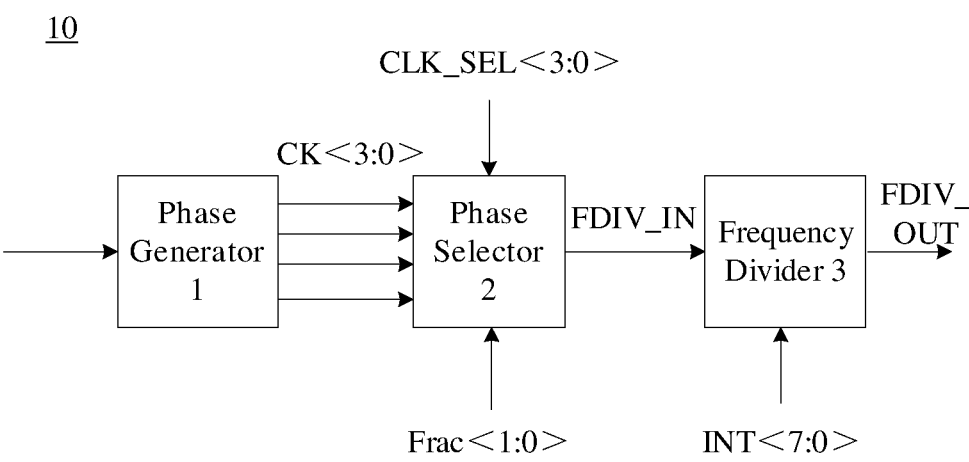
FIG. 1 is a schematic diagram of a clock signal noise reduction device according to an embodiment of the present application.

Multi-phase delay PLL 100; Clock signal noise reduction device 10;

phase generator 1; phase selector 2; frequency divider 3; phase detector 4; phase delayer 5.

DESCRIPTION OF EMBODIMENTS

The following is a detailed description of embodiments of the present disclosure, and the embodiments described with reference to the accompanying drawings are exemplary.

A clock signal noise reduction device according to embodiments of the present application will be described below with reference to FIGS. 1 to 6.

In some embodiments of the present disclosure, FIG. 1 is a schematic diagram of a clock signal noise reduction device according to an embodiment of the present disclosure. The clock signal noise reduction device 10 includes a phase generator 1, a phase selector 2, and a frequency divider 3. The phase generator is used to generate phases and is known in the art, for example can be adjusted using Voltage Control Delay Line (VCDL), a ring oscillator, or another interpolation generating way. The phase selector is used to select, as an output, a needed signal from the generated phases using an MUX.

The phase generator 1 is configured to generate a multi-phase clock signal based on an input signal. Specifically, the input signal is a system-level clock signal of a multi-phase delay phase-locked loop. The multi-phase clock signal can be a two-phase clock signal, a four-phase clock signal, an eight-phase clock signal, or the like. The multi-phase clock signal is generated by delaying the input clock signal, and the initial input clock signal is a first-phase clock signal of the multi-phase clock signal.

In some embodiments, the phase generator 1 is a four-phase generator, and the four-phase generator can be a high frequency four-phase generation circuit. The four-phase generation circuit is generated through a relative delay chain to improve the circuit robustness, thereby generating a four-phase clock signal of 0°, 90°, 180°, and 270°. Moreover, due to the noise performance requirement of SDM (Sigma-Delta Modulation, Σ-Δ modulation), the delay difference among the four-phases should be controlled to be within 1 ps.

Figure 2:
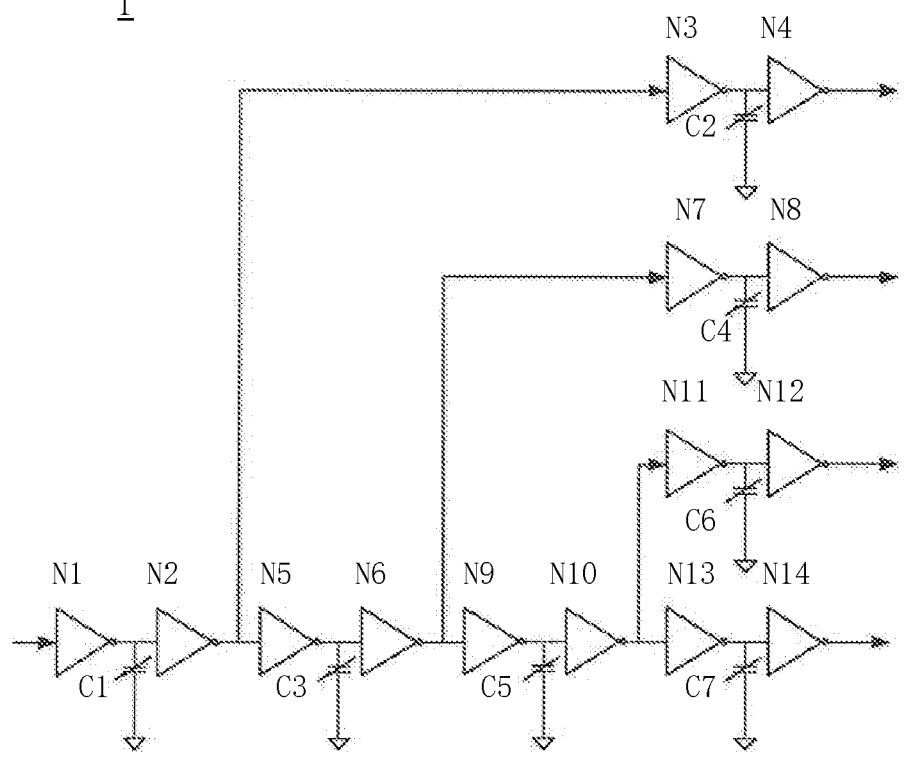
FIG. 2 is a schematic diagram of a four-phase generator according to an embodiment of the present application.

FIG. 2 is a schematic diagram of a four-phase generator according to an embodiment of the present disclosure. Each phase generator includes a variable capacitor configured to adjust time delay of a clock signal of the phase generator where the variable capacitor is located based on a first delay adjustment signal.

Specifically, the four-phase generator is composed of multiple drivers (such as drivers N1-N14) and multiple variable capacitors (such as variable capacitors C1-C7). The multi drivers and the multiple variable capacitors achieve outputting a four-phase clock signal through serial and parallel connections. The drives such as drivers N1, N2, N5, N6, N9, N10, N13, N14 and the variable capacitors such as variable capacitors C1, C3, C15, and C7, that are connected in series, are configured for coarse adjustment of the delay of the clock signals of the phase generators where they are located correspondingly. Additionally, the drives connected in parallel such as drivers N3, N4, N7, N8, N11, N12, and the variable capacitors connected in parallel such as variable capacitors C2, C4, and C6 are configured for fine adjustment of the delay of the clock signals of the phase generators where they are located correspondingly.

As shown in FIG. 1, the phase selector 2 has an input end connected to an output end of the phase generator 1. The phase selector 2 is configured to select a channel of the multi-phase clock signal based on phase information and assign a delay of a preset period to a clock signal of the selected channel. The phase selector 2 can be a logic circuit for the four-phase clock selection, and the logic circuit is provided with four clock channels, each of which is configured to transmit a clock signal of the four-phase time clock signal.

Furthermore, selection modes of the phase selector 2 can be set, with each mode representing a delay of a different preset period assigned to the clock signal of the selected channel. The preset period is smaller than the cycle period of the multi-phase clock signal. When the cycle period of the multiple-phase clock signal is 1, the preset period is a fraction of the cycle period of the multi-phase clock signal, which can be set as needed. In some embodiments, the preset cycle is 0.25 times the cycle period of the multi-phase clock signal (abbreviated as 0.25 cycles), or 0.5 times the cycle period of the multi-phase clock signal (abbreviated as 0.5 cycles), or 0.75 times the cycle period of the multi-phase clock signal (abbreviated as 0.75 cycles). That is to say, the phase selector 2 can delay the clock signal of the selected channel by 0.25 times the cycle period of the multi-phase clock signal or 0.5 times the cycle period of the multi-phase clock signal or 0.75 times the cycle period of the multi-phase clock signal.

For example, as shown in FIG. 1, the selection mode is set as a mode of Frac<1:0>, which represents assigning a delay of 0.5 times the cycle period of the multi-phase clock signal to the clock signal of the selected channel, that is, the preset period is 0.5 times the cycle period of the multi-phase clock signal (abbreviated as 0.5 cycle). Or, the selection mode can be set as a mode of Frac<1:0>, which represents assigning a delay of 0.25 times the cycle period of the multi-phase clock signal to the clock signal of the selected channel, that is, the preset cycle is 0.25 times the cycle period of the multi-phase clock signal (abbreviated as 0.25 cycles). Or, the selection mode can be set as a mode of Frac<1:1>, which represents assigning a delay of 0.75 times the cycle period of the multi-phase clock signal to the clock signal of the selected channel, that is, the preset period is 0.75 times the cycle period of the multi-phase clock signal (abbreviated as 0.75 cycles). Or, the selection mode can be set as a mode of Frac<0:0>, which represents assigning a delay of one times the cycle period of the multi-phase clock signal to the clock signal of the selected channel (abbreviated as 1 cycle), and this case may not be an option here.

Furthermore, taking the preset period of 0.25 cycles as an example, when a delay of 0.25 cycles is assigned to the clock signal of the selected channel, the generated clock signals of four phases all are delayed by 0.25 cycles.

The divider 3 has an input end connected to an output end of the phase selector 2, and is configured to perform fractional frequency division on the multi-phase clock signal that is delayed by the preset period to reduce a signal noise.

Specifically, the frequency divider 3 can perform frequency division on a received higher frequency signal to obtain a required low-frequency signal. As shown in FIG. 1, the multi-phase clock signal (that is, the high-frequency signal) delayed by the preset period is used as an input signal (represented by FDIV_IN) of the frequency divider 3. The frequency divider 3 outputs a low-frequency signal (represented by FDIV_OUT) after performing the fractional frequency division on the multi-phase clock signal delayed by the preset period. The frequency divider 3 is a decimal frequency divider, such as a 255 frequency divider, and can be used to perform frequency division on a 8 G-10 G signal, where INT<7:0> indicates an set frequency division mode of the frequency divider 3. The frequency division mode can be set as needed without specific limitations.

A case in which clock signals of four phases in the four-phase clock signal received by the frequency divider 3 being delayed by 0.25 cycles is taken as an example. The frequency divider 3 adopts a certain method to miss the counting of one or more cycles among several frequency division cycles so as to obtain a decimal frequency dividing ratio in the overall average sense of an entire counting cycle, the fractional frequency dividing ratio being 0.25.

It can be understood that when the phase selector 2 is not set, the frequency dividing ratio obtained after the frequency divider 3 performing the frequency division processing on the four-phase clock signal is usually an integer, and the SDM noise of the low-frequency signal output by the frequency divider 3 is relatively high. By setting the phase selector 2 and assigning a delay of a different preset period to the clock signal of the selected channel, for example the preset period being 0.25 cycles, a frequency dividing ratio of 0.25 can be obtained after the frequency divider 3 performing the frequency division processing on the four-phase clock signal, which means that the SDM noise of the output low-frequency signal can be reduced to a quarter of the original SDM noise without the phase selector 2. In this way, the impact of SDM noise can be effectively reduced and the SX noise can be optimized to a certain extent.

According to the clock signal noise reduction device 10 proposed in the embodiment of the present disclosure, it can delay the multi-phase clock signal output by the phase generator 1 by the preset period through setting the phase selector 2, so that the frequency divider 3 can obtain a fractional frequency dividing ratio after performing a fractional frequency division on the multi-phase clock signal delayed by the preset period, thereby reducing the noise of the output low-frequency signal to a fraction of the original noise without the phase selector 2, and thus reducing signal noise and improving the performance of the frequency divider 3.

Figure 3:
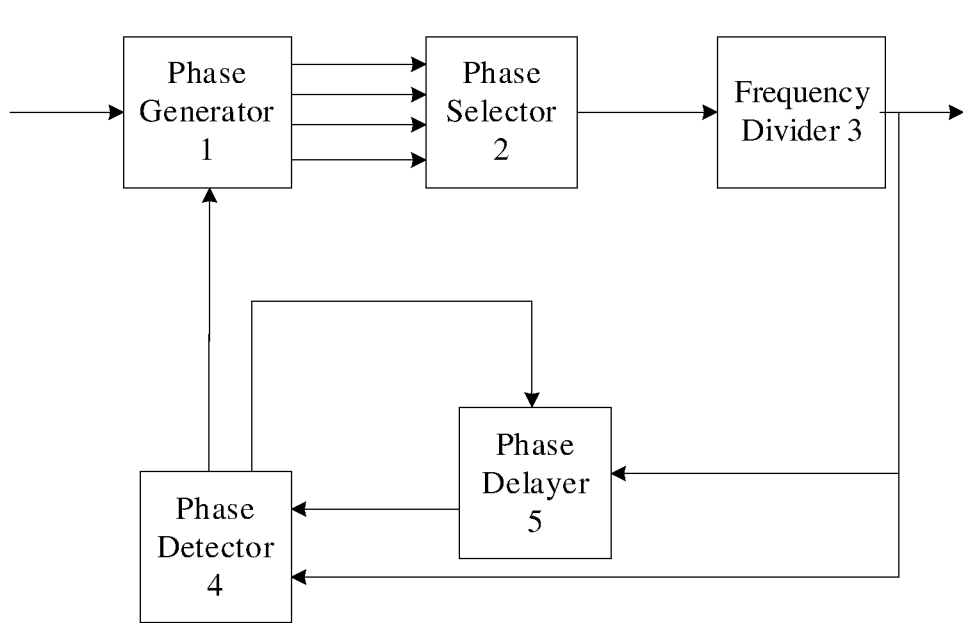
FIG. 3 is a schematic diagram of a clock signal noise reduction device according to another embodiment of the present application.

In some embodiments of the present disclosure, FIG. 3 is a schematic diagram of a clock signal noise reduction device according to another embodiment of the present application. The clock signal noise reduction device 10 further includes a phase detector 4.

The phase detector 4 is connected to an output end of the frequency divider 3 and a signal regulating end of the multi-phase generator 1, and is configured to obtain a phase difference between a clock signal in a current channel that has been subject to the fractional frequency division and a clock signal in an immediately previous channel that has been subject to the fractional frequency division, and generate a first delay adjustment signal based on the phase difference.

Figure 4:
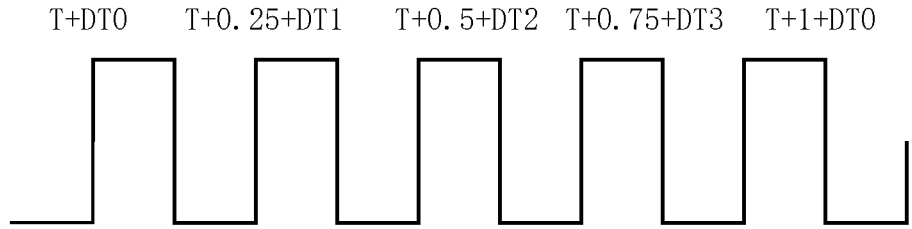
FIG. 4 is a schematic diagram of a multi-phase clock signal after fractional division according to an embodiment of the present application.

Specifically, FIG. 4 is a schematic diagram of the multi-phase clock signal after fractional frequency division according to an embodiment of the present disclosure. Taking a four-phase clock signal in one cycle that is obtained after fractional frequency division as an example, it can be seen from FIG. 4 that a first-phase clock signal is T+DT0, which is the first-phase clock signal after T cycles, a second-phase clock signal is T+0.25+DT1, and a third-phase clock signal is T+0.5+DT2, a fourth-phase clock signal is T+0.75+DT3, and T+1+DT0 belongs to a four-phase clock signal in the next cycle that is obtained after fractional frequency division. Therefore, it can be seen that within a cycle, the phase difference between a clock signal in a current channel and a clock signal in an immediately previous channel is a quarter of the cycle.

Furthermore, the phase detector 4 calculates the phase difference between the clock signal in the current channel and the clock signal in the immediately previous channel after obtaining a fractional frequency divided multi-phase clock signal, and generates the first delay adjustment signal based on this phase difference. The multi-phase generator 1 is further configured to adjust the delay of the clock signal in the current channel or the clock signal in the immediately previous channel based on the first delay adjustment signal.

Specifically, when the clock signal in the current channel is a second-phase clock signal and the clock signal in the immediately previous channel is a first-phase clock signal, the phase difference between these two clock signals is DELTA1=DT1−DT0. When the clock signal in the current channel is a third-phase clock signal and the clock signal in the immediately previous channel is a second-phase clock signal, the phase difference between these two clock signals is DELTA2=DT2−DT1. When the clock signal in the current channel is a fourth-phase clock signal and the clock signal in the immediately previous channel is a third-phase clock signal, the phase difference between these two clock signals is DELTA3=DT3-DT2.

Figure 5:
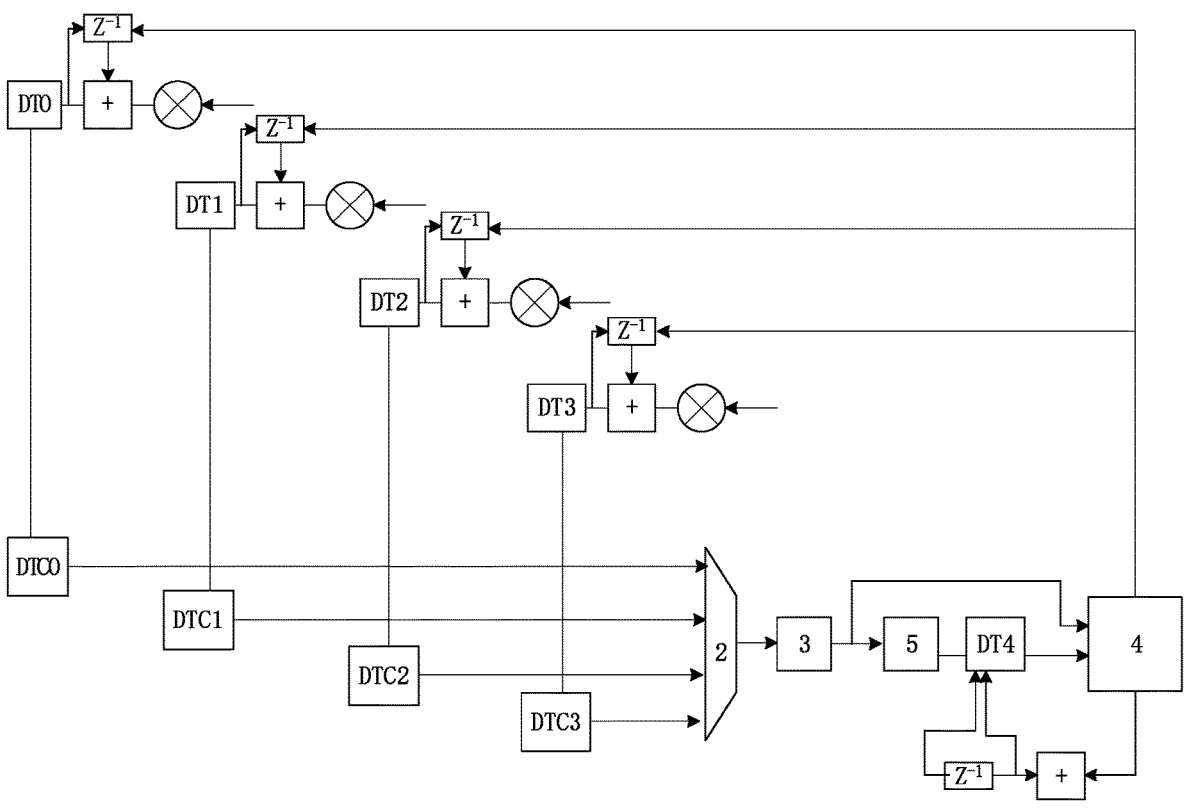
FIG. 5 is a schematic diagram of a calibration algorithm according to an embodiment of the present application.

Further, FIG. 5 is a schematic diagram of a calibration algorithm according to an embodiment of the present disclosure. The phase difference calculated by the phase detector 4 after obtaining the fractional frequency divided multi-phase clock signal is a phase error amount. For example, if the obtained phase difference is 10, it indicates that the period of the delay of the clock signal in the current channel relative to the clock signal in the immediately previous channel is overshort. If the obtained phase difference is 01, it indicates the period of the delay of the clock signal in the current channel relative to the clock signal in the immediately previous channel is overlong. If the obtained phase difference is 00, it indicates that the delay of the clock signal in the current channel relative to the clock signal in the immediately previous channel is accurate.

The phase error amount can be a value having a direction. The phase detector 4 generates the first delay adjustment signal based on the calculated phase difference, and sends it to a corresponding phase generator in the multi-phase generator 1. A value of the phase difference between clock signals in the current channel and the immediately previous channel can be used as adjustment information. For example, when the obtained value is positive, it indicates that the delay between the clock signal in the current channel and the clock signal in the immediately previous channel is too large. At this time, the phase detector 4 should send the first delay adjustment signal to the corresponding phase generator 1 to adjust the variable resistor in the phase generation circuit corresponding to the clock signal in the current channel, so as to reduce the delay of the multi-phase clock signal generated by the corresponding phase generation circuit, or to send the first delay adjustment signal to adjust the variable resistance in the phase generation circuit corresponding to the clock signal in the immediately previous channel so as to increase the delay of the multi-phase clock signal generated by the corresponding phase generation circuit. In this way, the phase accuracy of the two adjacent-phase clock signals can be adjusted and improved.

In some embodiments of the present disclosure, as shown in FIG. 3, the clock signal noise reduction device 10 further includes a phase delayer 5.

The phase delayer 5 is connected to the output end of the frequency divider 3 and an input end of the phase detector 4, and is configured to perform a delay processing on the multi-phase clock signal that has been subject to fractional frequency division so as to obtain a multi-phase clock signal that has been subject to the fractional frequency division and the delay processing.

Figure 6:
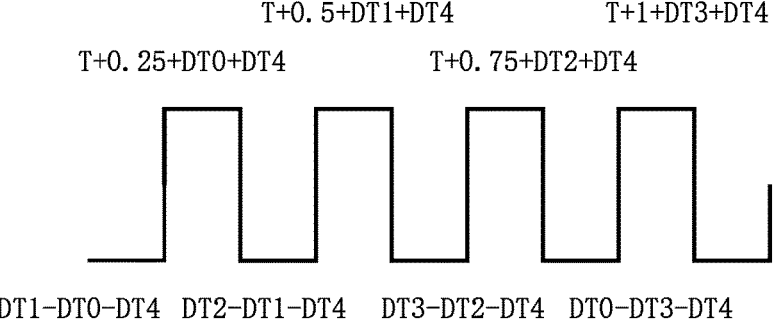
FIG. 6 is a schematic diagram of a clock signal obtained after performing a delay processing on a multi-phase clock signal that has been subject to a fractional division according to an embodiment of the present application.

Specifically, FIG. 6 is a schematic diagram of delay processing on a multi-phase clock signal that has been subject to fractional frequency division according to an embodiment of the present disclosure. An obtained four-phase clock signal that has been subject to fractional frequency division within one cycle is taken as an example. The phase delayer 5 is configured to set delay time length for a delay processing on the multi-phase clock signal that has been subject to the fractional frequency division. The phase delayer 5 receives the multi-phase clock signal that has been subject to fractional frequency division, which is output by the frequency divider 3, and performs a delay processing on received clock signals in all cycles. Taking a delay of 0.25 cycles as an example, the delayed cycle signal is N.25 and N.25 is used as a standard quantity.

The phase detector 4 is connected to the output end of the phase delayer 5, and is configured to generate a second delay adjustment signal based on the multi-phase clock signal that has been subject to the fractional frequency division and the multi-phase clock signal that has been subject to the fractional frequency division and the delay processing. The phase delayer 5 is further configured to adjust, based on the second delay adjustment signal, a delay time length for the delay processing on the multi-phase clock signal that has been subject to the fractional frequency division.

The phase detector 4 compares the received multi-phase clock signal that has been subject to the fractional frequency division with the multi-phase clock signal that has been subject to the fractional frequency division and the delay processing. When the phase delayer 5 performs a delay processing on the multi-phase clock signal that has been subject to the fractional frequency division, and the ideal output should be $(N+0.25)*Tvco$, where N represents a frequency dividing ratio and Tvco is equal to $1/fvco$ and represents a frequency. It can be understood that, taking the standard quantity of N.25 as an example, the occurrence time points of a rising edge and a falling edge of the received multi-phase clock signal that has been subject to the fractional frequency division should completely correspond to the occurrence time points of a rising edge and a falling edge of the multi-phase clock signal that has been subject to the fractional frequency division and the delay processing. Taking the multi-phase clock signal that has been subject to the fractional frequency division and the delay processing as a reference, by comparing the current phase and a phase value obtained after delaying the immediately previous phase by 0.25 cycles, the phase error amount between the current phase and the immediately previous phase is determined to drive a subsequent algorithm to adjust the delay of the current phase.

Specifically, as shown in FIG. 5, the phase detector 4 can add up and integrate the received multi-phase clock signal that has been subject to the fractional frequency division and the delay processing according to the formula $SUM=-4*DT4=1*T$, where $DT4=0.25T$. Herein, the four-phase difference is integrated into a fixed value and sent to the phase delayer 5 to reversely adjust the delay DT4 in the phase delayer 5.

Figures 7, 8:
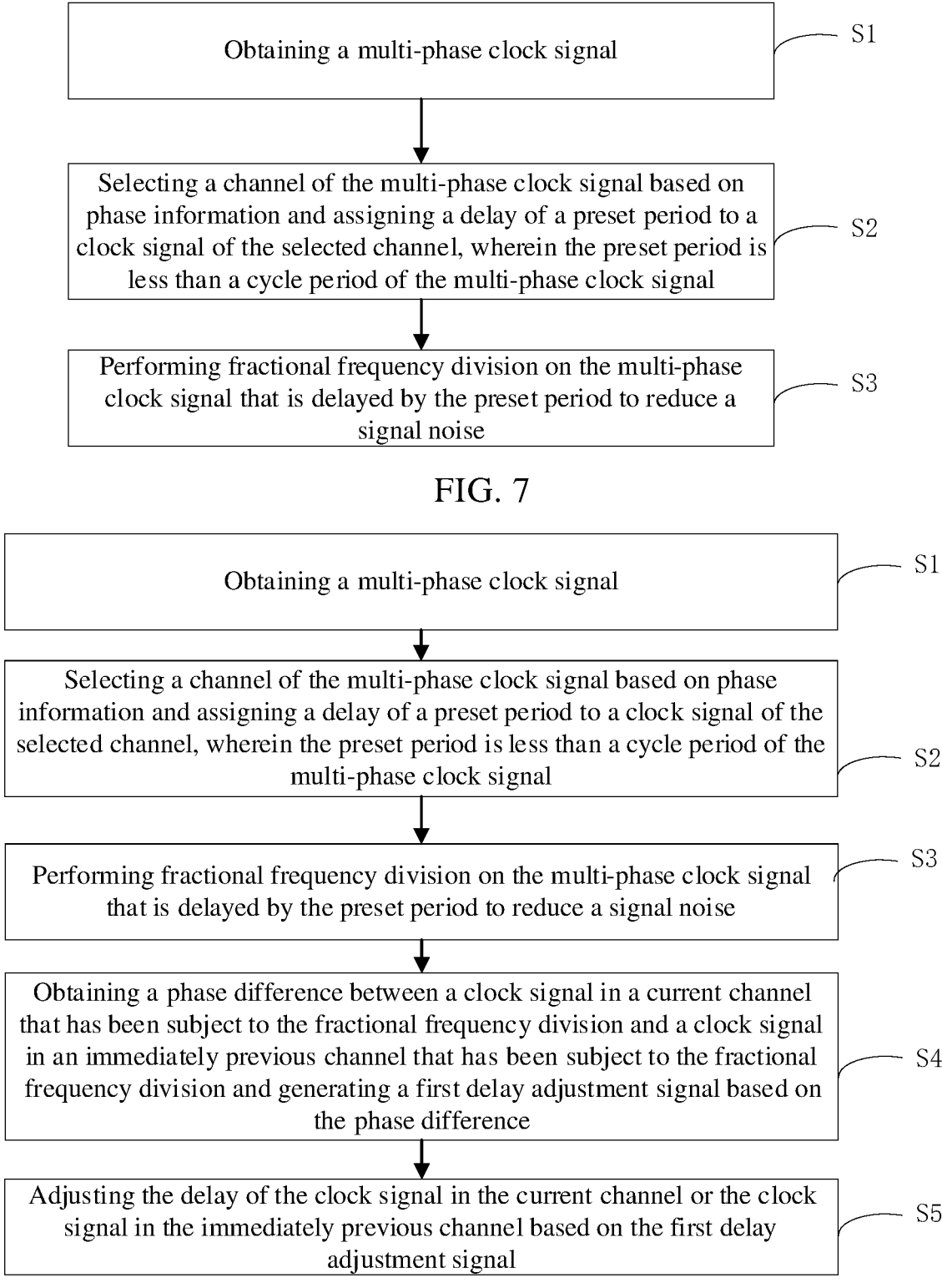
FIG. 7 is a flowchart of a clock signal noise reduction method according to an embodiment of the present application.
FIG. 8 is a flowchart of a clock signal noise reduction method according to another embodiment of the present application.

In some embodiments of the present disclosure, FIG. 7 is a flowchart of a clock signal noise reduction method according to an embodiment of the present disclosure. The clock signal noise reduction method includes steps S1-S3 as follows.

At S1, a multi-phase clock signal is acquired.

A four-phase generator as shown in FIG. 2 can be used. The four-phase generator can be a high frequency four-phase generation circuit. The four-phase generation circuit is generated through a relative delay chain to improve the circuit robustness, thereby generating a four-phase clock signal of 0°, 90°, 180°, and 270°. Moreover, due to the noise performance requirement of SDM, the delay difference among the four-phases should be controlled to be within 1 ps.

At S2, a channel of the multi-phase clock signal is selected based on phase information, and a delay of a preset period is assigned to a clock signal of the selected channel. The preset period is less than a cycle period of the multi-phase clock signal.

A four-phase clock selection logic circuit can be adopted, in which four clock channels are provided for the transmission of four phase clock signals respectively. Selection modes of the four-phase clock selection logic circuit can be set, with each mode representing a delay of a different preset period assigned to the clock signal of the selected channel. The preset period is smaller than the cycle period of the multi-phase clock signal. When the cycle period of the multiple-phase clock signal is 1, the preset period is a fraction of the cycle period of the multi-phase clock signal, which can be set as needed. In some embodiments, the preset cycle is 0.25 times the cycle period of the multi-phase clock signal (abbreviated as 0.25 cycles), or 0.5 times the cycle period of the multi-phase clock signal (abbreviated as 0.5 cycles), or 0.75 times the cycle period of the multi-phase clock signal (abbreviated as 0.75 cycles). That is to say, the four-phase clock selection logic circuit can delay the clock signal of the selected channel by 0.25 cycles, 0.5 cycles or 0.75 cycles.

The selection mode is set as a mode of Frac<1:0>, which represents assigning a delay of 0.5 cycles to the clock signal of the selected channel, that is, the preset period is 0.5 cycles. Or, the selection mode can be set as a mode of Frac<1:0>, which represents assigning a delay of 0.25 cycles to the clock signal of the selected channel, that is, the preset cycle is 0.25 cycles. Or, the selection mode can be set as a mode of Frac<1:1>, which represents assigning a delay of 0.75 cycles to the clock signal of the selected channel, that is, the preset period is 0.75 cycles. Or, the selection mode can be set as a mode of Frac<0:0>, which represents assigning a delay of one cycle to the clock signal of the selected channel, and this case may not be an option here.

At S3, fractional frequency division is performed on the multi-phase clock signal that is delayed by the preset period to reduce a signal noise.

A decimal frequency divider can be used to perform a fractional frequency division on the multi-phase clock signal that is delayed by the preset period. For example, a 255 frequency divider can be used to achieve the frequency division on a 8 G-10 G signal. Specifically, the decimal frequency divider can perform a frequency division on the received high-frequency signal to obtain the desired low-frequency signal. A case in which clock signals of four phases in the four-phase clock signal received by the frequency divider being delayed by 0.25 cycles is taken as an example. The decimal frequency divider adopts a certain method to miss the counting of one or more cycles among several frequency division cycles so as to obtain a decimal frequency dividing ratio in the overall average sense of an entire counting cycle, the decimal frequency dividing ratio being 0.25.

According to the clock signal noise reduction method proposed in the embodiment of the present disclosure, the generated multi-phase clock signal is delayed by a preset period, so that the frequency divider can obtain a decimal frequency dividing ratio after performing the fractional frequency division on the multi-phase clock signal that is delayed by the preset period, so as to reduce the noise of the output low-frequency signal to a fraction of an original noise and thus to reduce the signal noise.

In some embodiments of the present disclosure, FIG. 8 is a flowchart of a clock signal noise reduction method according to another embodiment of the present disclosure. The clock signal noise reduction method further includes steps S4 and S5 as follows.

At S4, a phase difference between a clock signal in a current channel that has been subject to the fractional frequency division and a clock signal in an immediately previous channel that has been subject to the fractional frequency division is obtained, and a first delay adjustment signal is generated based on the phase difference.

Specifically, when the clock signal in the current channel is a second-phase clock signal and the clock signal in the immediately previous channel is a first-phase clock signal, the phase difference between these two clock signals is DELTA1=DT1-DT0. When the clock signal in the current channel is a third-phase clock signal and the clock signal in the immediately previous channel is a second-phase clock signal, the phase difference between these two clock signals is DELTA2=DT2-DT1. When the clock signal in the current channel is a fourth-phase clock signal and the clock signal in the immediately previous channel is a third-phase clock signal, the phase difference between these two clock signals is DELTA3=DT3-DT2.

The phase difference calculated after obtaining the fractional frequency divided multi-phase clock signal is a phase error amount. For example, if the obtained phase difference is 10, it indicates that the period of the delay of the clock signal in the current channel relative to the clock signal in the immediately previous channel is overshort. If the obtained phase difference is 01, it indicates the period of the delay of the clock signal in the current channel relative to the clock signal in the immediately previous channel is overlong. If the obtained phase difference is 00, it indicates that the delay of the clock signal in the current channel relative to the clock signal in the immediately previous channel is accurate.

At S5, the delay of the clock signal in the current channel or the clock signal in the immediately previous channel is adjusted based on the first delay adjustment signal.

The phase error amount can be a value having a direction. The first delay adjustment signal is generated based on the calculated phase difference, and is sent to a corresponding phase generator in the multi-phase generator 1. A value of the phase difference between clock signals in the current channel and the immediately previous channel can be used as adjustment information. For example, when the obtained value of the phase difference is positive, it indicates that the delay between the clock signal in the current channel and the clock signal in the immediately previous channel is too large. At this time, the phase detector 4 should send the first delay adjustment signal to the corresponding phase generator 1 to adjust the variable resistor in the phase generation circuit corresponding to the clock signal in the current channel, so as to reduce the delay of the multi-phase clock signal generated by the corresponding phase generation circuit, or to send the first delay adjustment signal to adjust the variable resistance in the phase generation circuit corresponding to the clock signal in the immediately previous channel so as to increase the delay of the multi-phase clock signal generated by the corresponding phase generation circuit. In this way, the phase accuracy of the two adjacent-phase clock signals can be adjusted and improved.

Figures 9, 10:
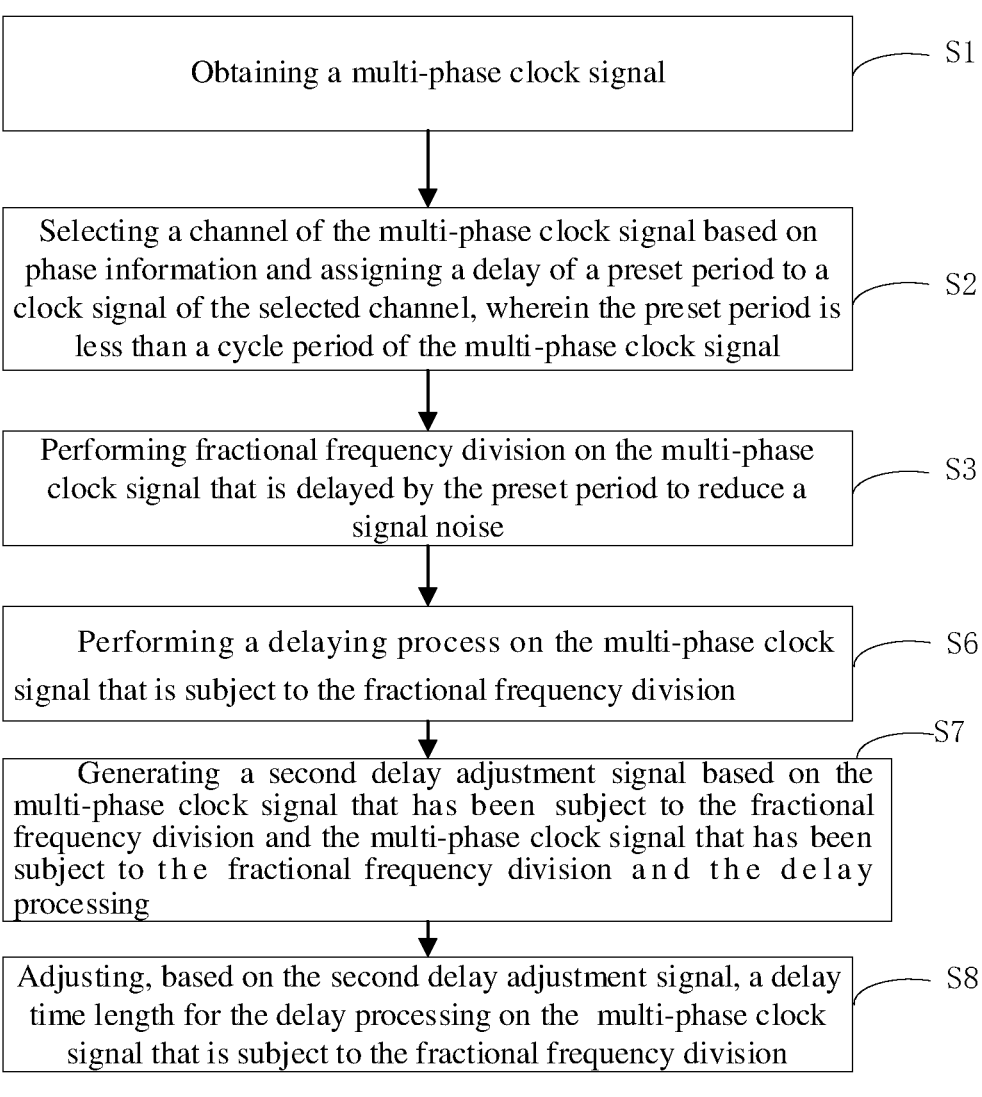
FIG. 9 is a flowchart of a clock signal noise reduction method according to another embodiment of the present application.
FIG. 10 is a block diagram of a multi-phase delay locked loop according to an embodiment of the present application.

In some embodiments of the present disclosure, FIG. 9 is a flowchart of a clock signal noise reduction method according to another embodiment of the present disclosure. The clock signal noise reduction method further includes steps S6-S8 as follows.

At S6, the multi-phase clock signal that has been subject to the fractional frequency division has been subject to a delay processing.

An obtained four-phase clock signal that has been subject to fractional frequency division within one cycle is taken as an example. The phase delayer 5 is configured to set a delay time length for a delay processing on the multi-phase clock signal that has been subject to the fractional frequency division. The phase delayer 5 receives the multi-phase clock signal that has been subject to fractional frequency division, which is output by the frequency divider 3, and performs a delay processing on received clock signals in all cycles. Taking a delay of 0.25 cycles as an example, the delayed cycle signal is N.25 and N.25 is used as a standard quantity.

At S7, a second delay adjustment signal is generated based on the multi-phase clock signal that has been subject to the fractional frequency division and the multi-phase clock signal that has been subject to fractional frequency division and the delay processing.

The delay time for the delay processing on the multi-phase clock signal that has been subject to the fractional frequency division is adjusted based on the second delay adjustment signal.

At S8, a time length of the delay processing on the multi-phase clock signal that has been subject to the fractional frequency division is adjusted based on the second delay adjustment signal.

The received multi-phase clock signal that has been subject to the fractional frequency division is compared with the multi-phase clock signal that has been subject to the fractional frequency division and the delay processing. When the phase delayer 5 performs a delay processing on the multi-phase clock signal that has been subject to the fractional frequency division, and the ideal output should be $(N+0.25)*Tvco$, where N represents a frequency dividing ratio and Tvco is equal to 1/fvco and represents a frequency. It can be understood that, taking the standard quantity of N.25 as an example, the occurrence time points of a rising edge and a falling edge of the received multi-phase clock signal that has been subject to the fractional frequency division should completely correspond to the occurrence time points of a rising edge and a falling edge of the multi-phase clock signal that has been subject to the fractional frequency division and the delay processing. Taking the multi-phase clock signal that has been subject to the fractional frequency division and the delay processing as a reference, by comparing the current phase and a phase value obtained after delaying the immediately previous phase by 0.25 cycles, the phase error amount between the current phase and the immediately previous phase is determined to drive a subsequent algorithm to adjust the delay of the current phase.

The received multi-phase clock signal that has been subject to the fractional frequency division and the delay processing is added up and integrated according to the formula $SUM=-4*DT4=1*T$, where DT4=0.25T. Herein, the four-phase difference is integrated into a fixed value and is used to reversely adjust the delay DT4 in the phase delayer 5.

In some embodiments of the present disclosure, FIG. 10 is a block diagram of a multi-phase delay phase-locked loop according to an embodiment of the present disclosure. The multi-phase delay phase-locked loop 100 includes the clock signal noise reduction device 10 according to any of the above embodiments.

In the multi-phase delay phase-locked loop 100 according to the embodiment of the present disclosure, by setting the clock signal noise reduction device 10, it can not only ensure to the maximum extent that the delay time periods of respective delay units are equal, but also reduce a signal noise.

The other components and operations of the clock signal noise reduction device 10 and the multi-phase delay phase-locked loop 100 according to the embodiments of the present disclosure are known to the person of ordinary skills in the art, and will not be described in detail here.

In the illustration of this description, an illustration with reference to the terms "one embodiment", "some embodiments", "illustrative embodiments", "an example", "a particular example" or "some examples" and so on mean that a particular feature, structure, material, or characteristic described in connection with the embodiment(s) or example(s) is included in at least one embodiment or example of the present disclosure. In this description, the exemplary expressions of the above terms do not necessarily specify the same embodiments or examples.

Although embodiments of the present disclosure have been shown and described, it will be understood by those skilled in the art that various changes, modifications, alternations and modifications may be made to these embodiments without departing from the principles and spirit of the present disclosure, the scope of which is defined by the claims and their equivalents.

What is claimed is:

1. A clock signal noise reduction device, comprising:
a phase generator configured to generate a multi-phase clock signal based on an input signal;
a phase selector having an input end connected with an output end of the phase generator, the phase selector being configured to select a channel of the multi-phase clock signal based on phase information and assign a delay of a preset period to a clock signal of the selected channel, wherein the preset period is less than a cycle period of the multi-phase clock signal; and
a frequency divider having an input end connected to an output end of the phase selector, the frequency divider being configured to perform fractional frequency division on the multi-phase clock signal that is delayed by the preset period to reduce a signal noise.

2. The clock signal noise reduction device according to claim 1, further comprising:
a phase detector connected to an output end of the frequency divider and a signal regulating end of the phase generator, and configured to obtain a phase difference between a clock signal in a current channel that has been subject to the fractional frequency division and a clock signal in an immediately previous channel that has been subject to the fractional frequency division and generate a first delay adjustment signal based on the phase difference,
wherein the phase generator is further configured to adjust the delay of the clock signal in the current channel or the clock signal in the immediately previous channel based on the first delay adjustment signal.

3. The clock signal noise reduction device according to claim 2, further comprising:
a phase delayer connected to the output end of the frequency divider and an input end of the phase detector, and configured to perform a delay processing on the multi-phase clock signal that has been subject to the fractional frequency division,
wherein the phase detector is connected to an output end of the phase delayer and is configured to generate a second delay adjustment signal based on the multi-phase clock signal that has been subject to the fractional frequency division and the multi-phase clock signal that has been subject to the fractional frequency division and the delay processing,
wherein the phase delayer is further configured to adjust, based on the second delay adjustment signal, a delay time length for the delay processing on the multi-phase clock signal that has been subject to the fractional frequency division.

4. The clock signal noise reduction device according to claim 2, wherein the phase generator is a four-phase generator, and each phase generator in the four-phase generator comprises a variable capacitor configured to adjust, based on the first delay adjustment signal, the delay of the clock signal of the phase generator where the variable capacitor is located.

5. The clock signal noise reduction device according to claim 3, wherein the phase generator is a four-phase generator, and each phase generator in the four-phase generator comprises a variable capacitor configured to adjust, based on the first delay adjustment signal, the delay of the clock signal of the phase generator where the variable capacitor is located.

6. The clock signal noise reduction device according to claim 2, wherein the phase generator is further configured to adjust a variable resistor in the phase generation circuit corresponding to the clock signal in the current channel based on the first delay adjustment signal to adjust the delay of the clock signal in the current channel, or configured to adjust a variable resistor in the phase generation circuit corresponding to the clock signal in the immediately previous channel to adjust the delay of the clock signal in the immediately previous channel.

7. The clock signal noise reduction device according to claim 3, wherein the phase generator is further configured to adjust a variable resistor in the phase generation circuit corresponding to the clock signal in the current channel based on the first delay adjustment signal to adjust the delay of the clock signal in the current channel, or configured to adjust a variable resistor in the phase generation circuit corresponding to the clock signal in the immediately previous channel to adjust the delay of the clock signal in the immediately previous channel.

8. The clock signal noise reduction device according to claim 4, wherein the phase generator is further configured to adjust a variable resistor in the phase generation circuit corresponding to the clock signal in the current channel based on the first delay adjustment signal to adjust the delay of the clock signal in the current channel, or configured to adjust a variable resistor in the phase generation circuit corresponding to the clock signal in the immediately previous channel to adjust the delay of the clock signal in the immediately previous channel.

9. The clock signal noise reduction device according to claim 1, wherein the preset period is 0.25 times the cycle period of the multi-phase clock signal or 0.5 times the cycle period of the multi-phase clock signal or 0.75 times the cycle period of the multi-phase clock signal.

10. The clock signal noise reduction device according to claim 2, wherein the preset period is 0.25 times the cycle period of the multi-phase clock signal or 0.5 times the cycle period of the multi-phase clock signal or 0.75 times the cycle period of the multi-phase clock signal.

11. A clock signal noise reduction method, comprising:

obtaining a multi-phase clock signal;

selecting a channel of the multi-phase clock signal based on phase information and assigning a delay of a preset period to a clock signal of the selected channel, wherein the preset period is less than a cycle period of the multi-phase clock signal; and performing fractional frequency division on the multi-phase clock signal that is delayed by the preset period to reduce a signal noise.

12. The clock signal noise reduction method according to claim 11, further comprising:

obtaining a phase difference between a clock signal in a current channel that has been subject to the fractional frequency division and a clock signal in an immediately previous channel that has been subject to the fractional frequency division and generating a first delay adjustment signal based on the phase difference; and adjusting the delay of the clock signal in the current channel or the clock signal in the immediately previous channel based on the first delay adjustment signal.

13. The clock signal noise reduction method according to claim 12, further comprising:

performing a delay processing on the multi-phase clock signal that has been subject to the fractional frequency division;

generating a second delay adjustment signal based on the multi-phase clock signal that has been subject to the fractional frequency division and the multi-phase clock signal that has been subject to the fractional frequency division and the delay processing; and adjusting, based on the second delay adjustment signal, a delay time length for the delay processing on the multi-phase clock signal that has been subject to the fractional frequency division.

14. The clock signal noise reduction method according to claim 12, wherein said adjusting the delay of the clock signal in the current channel or the clock signal in the immediately previous channel based on the first delay adjustment signal, comprising:

adjusting a variable resistor in a phase generation circuit corresponding to the clock signal in the current channel based on the first delay adjustment signal to adjust the delay of the clock signal in the current channel, or adjusting a variable resistor in a phase generation circuit corresponding to the clock signal in the immediately previous channel to adjust the delay of the clock signal in the immediately previous channel.

15. The clock signal noise reduction method according to claim 13, wherein said adjusting the delay of the clock signal in the current channel or the clock signal in the immediately previous channel based on the first delay adjustment signal, comprising:

adjusting a variable resistor in a phase generation circuit corresponding to the clock signal in the current channel based on the first delay adjustment signal to adjust the delay of the clock signal in the current channel, or adjusting a variable resistor in a phase generation circuit corresponding to the clock signal in the immediately previous channel to adjust the delay of the clock signal in the immediately previous channel.

16. The clock signal noise reduction method according to claim 11, wherein the preset period is 0.25 times the cycle period of the multi-phase clock signal, or 0.5 times the cycle period of the multi-phase clock signal or 0.75 times the cycle period of the multi-phase clock signal.

17. The clock signal noise reduction method according to claim 12, wherein the preset period is 0.25 times the cycle period of the multi-phase clock signal, or 0.5 times the cycle period of the multi-phase clock signal or 0.75 times the cycle period of the multi-phase clock signal.

18. The clock signal noise reduction method according to claim 13, wherein the preset period is 0.25 times the cycle period of the multi-phase clock signal, or 0.5 times the cycle period of the multi-phase clock signal or 0.75 times the cycle period of the multi-phase clock signal.

19. The clock signal noise reduction method according to claim 14, wherein the preset period is 0.25 times the cycle period of the multi-phase clock signal, or 0.5 times the cycle period of the multi-phase clock signal or 0.75 times the cycle period of the multi-phase clock signal.

20. A multi-phase delay phase-locked loop, comprising the clock signal noise reduction device according to claim 1.

\* \* \* \* \*